(12) United States Patent
Simon et al.

(10) Patent No.: US 10,247,952 B2
(45) Date of Patent: Apr. 2, 2019

(54) POLARIZATION-CONTROLLED LASER LINE-PROJECTOR

(71) Applicant: COHERENT LASERSYSTEMS GMBH & CO. KG, Göttingen (DE)

(72) Inventors: Frank Simon, Göttingen (DE); Thomas Wenzel, Göttingen (DE); Ludwig Schwenger, Hannover (DE); Paul Van Der Wilt, Götingen (DE)

(73) Assignee: COHERENT LASERSYSTEMS GMBH & CO. KG, Göttingen (DE)

(*) Notice: Subject to any disclaimer, the term of this patent is extended or adjusted under 35 U.S.C. 154(b) by 258 days.

(21) Appl. No.: 15/001,544

(22) Filed: Jan. 20, 2016

(65) Prior Publication Data

US 2016/0259174 A1   Sep. 8, 2016

Related U.S. Application Data

(60) Provisional application No. 62/128,139, filed on Mar. 4, 2015.

(51) Int. Cl.
*B23K 26/06* (2014.01)
*G02B 27/09* (2006.01)
(Continued)

(52) U.S. Cl.
CPC ........ *G02B 27/285* (2013.01); *B23K 26/0604* (2013.01); *B23K 26/067* (2013.01);
(Continued)

(58) Field of Classification Search
CPC .. G02B 27/283; G02B 5/3083; G02B 27/286; G02B 27/0172; G02B 27/26;
(Continued)

(56) References Cited

U.S. PATENT DOCUMENTS 6,206,532 B1   3/2001   Hawes
7,408,714 B2   8/2008   Windpassinger et al.
(Continued)

FOREIGN PATENT DOCUMENTS

DE   102008027229 A1   12/2009
EP        0508413 A2    10/1992
WO     2008/048494 A2    4/2008

OTHER PUBLICATIONS

International Search Report and Written Opinion received for PCT Patent Application No. PCT/EP2016/053771, dated Apr. 26, 2016, 14 Pages.
(Continued)

*Primary Examiner* — Thomas K Pham
*Assistant Examiner* — Sharrief I Broome
(74) *Attorney, Agent, or Firm* — Morrison & Foerster LLP

(57) ABSTRACT

In a laser line projection apparatus, six spaced-apart unpolarized laser-beams are plane-polarized with low loss by a combination of a thin-film polarizer, a reflector, and two polarization rotators. Two beams are polarized in each of three polarization-orientations. Two of the polarization-orientations are orthogonally aligned with each other in P and S orientations. The other polarization-orientation is non-orthogonally aligned in an intermediate orientation. The beams are intensity-homogenized and projected into a line of radiation. Any point on the line of radiation is formed from rays with an angular distribution of polarization-orientation from S to P through the intermediate orientation and back to S through the intermediate orientation.

14 Claims, 2 Drawing Sheets

(51) Int. Cl.
  *G02B 27/28* (2006.01)
  *H01L 21/02* (2006.01)
  *H01L 27/12* (2006.01)
  *B23K 103/00* (2006.01)
  *B23K 26/067* (2006.01)
  *B23K 26/073* (2006.01)

(52) U.S. Cl.
  CPC ...... *B23K 26/0608* (2013.01); *B23K 26/0648* (2013.01); *B23K 26/0738* (2013.01); *G02B 27/0905* (2013.01); *G02B 27/286* (2013.01); *H01L 27/1285* (2013.01); *B23K 2103/56* (2018.08); *H01L 21/02532* (2013.01); *H01L 21/02678* (2013.01); *H01L 21/02686* (2013.01)

(58) Field of Classification Search
  CPC ........ G02B 27/28; G02B 5/30; G02B 27/145; G02B 27/48; G02B 2027/0178; G02B 27/285; G02B 27/10; G02B 6/2706; G02B 2027/0118; G02B 27/0101; G02B 27/1006
  See application file for complete search history.

(56) References Cited

U.S. PATENT DOCUMENTS

| | | |
|---|---|---|
| 7,428,039 B2 | 9/2008 | Ferber |
| 8,238,400 B2 | 8/2012 | Targsdorf et al. |
| 8,309,474 B1 | 11/2012 | Wang et al. |
| 8,937,770 B2 | 1/2015 | Simon et al. |
| 2002/0027716 A1 | 3/2002 | Tanaka |
| 2008/0014685 A1* | 1/2008 | Govorkov .......... B23K 26/0604 438/150 |
| 2011/0008973 A1 | 1/2011 | Kawaguchi et al. |
| 2012/0257387 A1 | 10/2012 | Kuchibhotla et al. |
| 2014/0027417 A1 | 1/2014 | Simon et al. |

OTHER PUBLICATIONS

Nishida et al., "Performance of Solid Green Laser Annealing System for LTPS TFTs", Ishikawajima-Harima Heavy Industries Co., Ltd., 2006, pp. 869-872.

* cited by examiner

POLARIZATION-CONTROLLED LASER LINE-PROJECTOR

PRIORITY

This application claims priority to U.S. Provisional Application Ser. No. 62/128,139, filed Mar. 4, 2015, the entire disclosure of which is incorporated by reference.

TECHNICAL FIELD OF THE INVENTION

The present invention relates in general to laser annealing of amorphous silicon coated panels. The invention relates in particular to laser annealing such panels with a line of radiation projected from one or more excimer laser-beams.

DISCUSSION OF BACKGROUND ART

Excimer laser annealing (ELA) is an established process for preparation of thin-film transistor (TFT) back-planes in the production of high quality display panels. Typically ELA involves irradiating a panel coated with amorphous silicon with a line of radiation projected from an excimer laser-beam. The excimer laser radiation changes the amorphous silicon to polycrystalline silicon.

Electrical performance of the TFTs takes advantage of a modified microstructure that is generated when the amorphous silicon is changed to polycrystalline silicon. The arrangement of crystallites of the polycrystalline silicon can be important for a specific TFT circuit design. Usually the crystallite arrangement follows a high degree of order after iterative excimer laser irradiation. It has been found that angular distribution and polarization of the laser radiation can affect the crystallite arrangement.

Excimer-laser line-projection apparatus is extensively described in the prior-art. By way of example, such apparatus is described in detail in U.S. Pat. No. 7,428,039, and in U.S. Pat. No. 8,937,770. Optical combination of beams for increasing irradiation power in such apparatus is described in detail in U.S. Pat. No. 7,408,714. Synchronization of pulsed beams from beam-combined lasers is described in detail in U.S. Pat. No. 8,238,400. All of the aforementioned patents are assigned to the assignee of the present invention, and all are hereby incorporated herein by reference.

An effective means of controlling polarization distribution in excimer-laser line-projection apparatus is not described in the prior-art. In general, excimer lasers used in such apparatus do not emit a plane-polarized beam, and causing such a laser to emit a plane-polarized beam would result in a substantial (50%) loss of available power. In actual laser projection apparatus, some degree of polarization (ellipticity) may be introduced into a beam by non-normal incidence reflections from turning-mirrors, attenuators, or passage through birefringent optical components. This will be incidental, and will certainly not provide for a controlled angular distribution of polarization at any incidence point in a projected line of radiation.

There is a need for excimer-laser line-projection apparatus that can provide a controlled distribution of polarization at any incidence point in a projected line of radiation on a silicon-coated panel. Preferably, this controlled distribution of polarization should be achieved without substantial loss of laser power, and should maintain the angular distribution of the incident radiation.

SUMMARY OF THE INVENTION

In one aspect, optical apparatus in accordance with the present invention comprises a plurality of polarizers arranged to receive a corresponding plurality of laser-beams and plane-polarize the laser-beams. The polarizers are configured such that at least two of the laser-beams are plane-polarized with different polarization-orientations. A plurality of optical elements is configured and arranged to project the plane-polarized laser-beams on a workpiece as a line of laser radiation with rays from each of the laser-beams incident at different angles on any point on the line. The polarization-orientation of the rays varies with angle-of-incidence in a predetermined manner.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
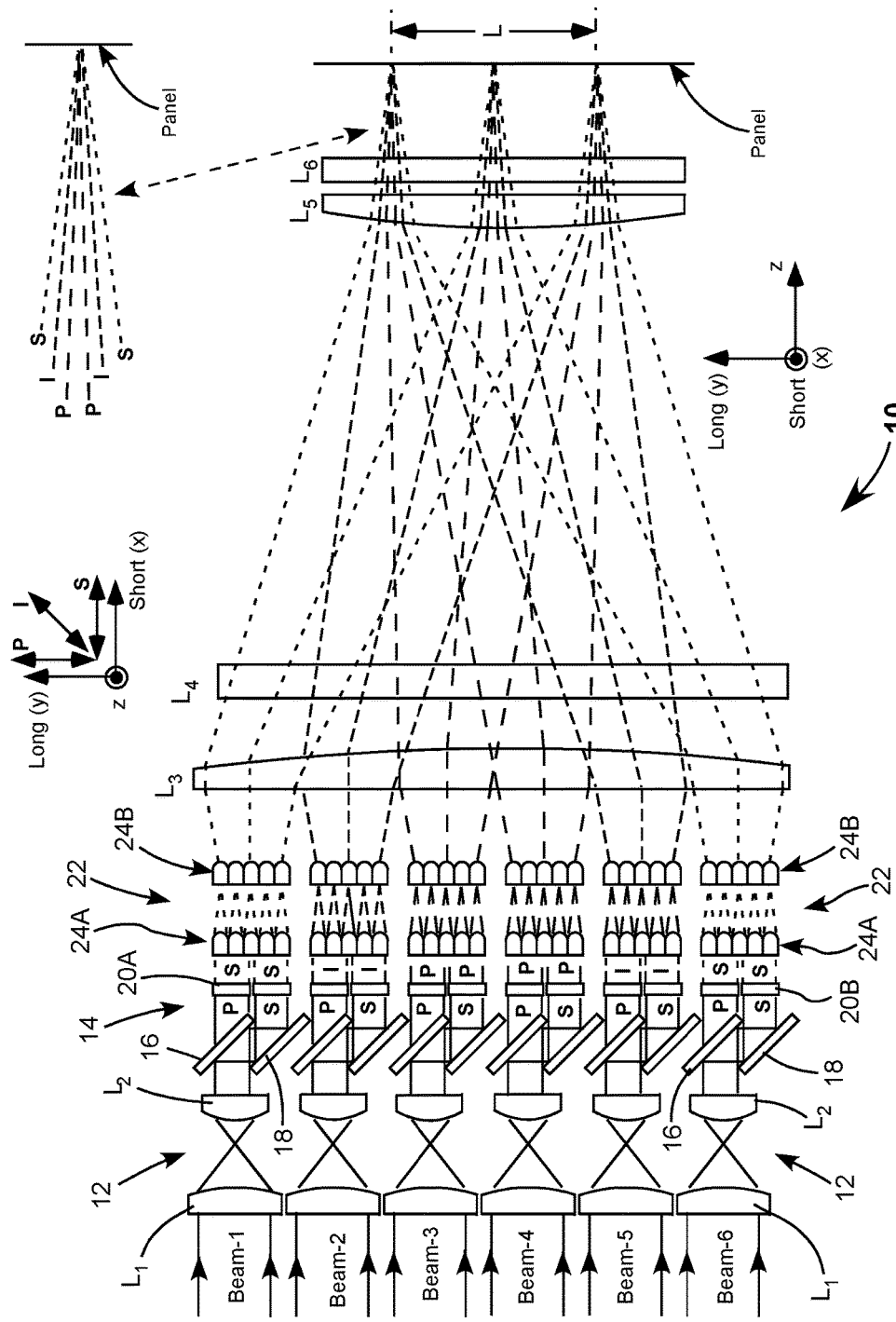
FIG. 1A schematically illustrates a preferred embodiment of excimer-laser line-projection apparatus arranged to receive six laser-beams, plane-polarize each of the six laser-beams without significant loss and with a predetermined polarization-orientation, and project the laser-beams with radiation-intensity homogenized in the projected line direction, but with a specific angular distribution of polarization-orientation at points along the projected line.
FIG. 1B schematically illustrates plane-polarization-orientations in the apparatus of FIG. 1A relative to orthogonally aligned, transverse (long and short) axes of the apparatus.
FIG. 1C schematically illustrates distribution of polarization-orientation varying with angle of incidence at a point at the end of the projected line on FIG. 1A with the polarization being S-oriented at the highest angle of incidence, P-oriented at the lowest angles of incidence, and with an intermediate orientation at angles of incidence between the highest and the lowest.

Referring now to the drawings, FIG. 1A schematically illustrates a preferred embodiment 10 of excimer-laser line-projection apparatus in accordance with the present invention. The apparatus is depicted in a long-axis plane (line-length plane) only. The Cartesian-axis system of long-axis, short axis, and propagation-axis (x-, y- and z-axes) is depicted adjacent the drawing.

Apparatus 10 is arranged to receive six, nominally unpolarized, nominally collimated, spaced-apart laser-beams, here designated as beams beam-1, beam-2, beam 3, beam-4, beam-5 and beam-6. The beams may be provided by six individual excimer lasers, or by less than six lasers with beams for each of the lasers divided by high-efficiency beam-splitters. By way of example beams from three lasers could each be divided into two equal portions to provide beam-1 through beam-6.

Each beam is characterized as having a long-axis (y-axis), a short axis (y-axis) perpendicular to the long axis, and a propagation-axis perpendicular the long and short-axes, as is known in the excimer-laser art. This axis system is depicted adjacent the drawing of FIG. 1A, which is in the y-z plane, with the length of projected line in the long-axis direction. The beams are aligned in the long-axis direction thereof.

Figure 2:
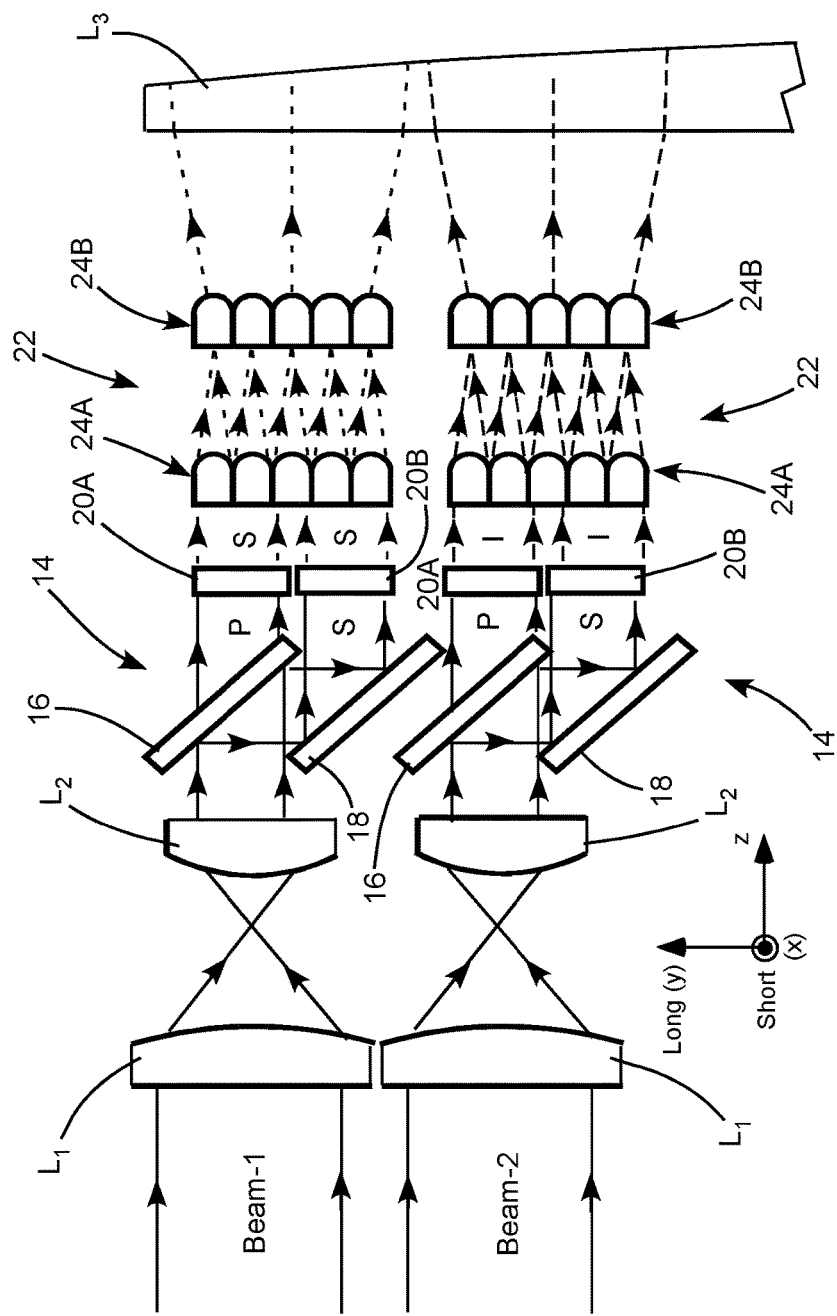
FIG. 2 schematically illustrates details of two of six polarization selective beam-dividers in the apparatus of FIG. 1A arranged for plane-polarizing each of the six laser-beams without significant loss and with a predetermined polarization-orientation.

Continuing with reference to FIG. 1A and with reference in addition to FIG. 2, each beam is passed through an afocal beam de-magnifier (telescope) 12 comprising lenses $L_1$ and $L_2$. The beam de-magnifier reduces the long-axis dimension of the beam by about a factor of 2. The reduced-dimension beam is directed to a polarization-selective beam-divider (polarizer) 14, including a polarization-selective beam-splitter 16, a reflector 18, and upper and lower polarization-rotators 20A and 20B respectively, such as half-wave plates. There are polarizers 14, one for each of the laser-beams. The polarizers are aligned in the long-axis direction of the laser-beams.

In a polarizer 14, the reduced-diameter beam is intercepted by polarization-selective beam-splitter 16 which transmits radiation plane-polarized in a P-orientation i.e., polarized in the plane of incidence of the beam-splitter 16, and reflects radiation plane-polarized in an S-orientation perpendicular to the P-orientation, i.e., perpendicular to the plane of incidence of beam splitter 16. The S-polarized radiation is reflected by reflector 18 parallel to the transmitted p-polarized radiation.

The S and P beam-portions of each of the six beams are intercepted respectively by upper and lower (in the sense of the drawing) polarization-rotators 20A and 20B respectively. In the case of S and P portions of beam-1 and beam 6, the lower polarization-rotator is arranged such that no net polarization-rotation occurs. The upper polarization-rotator is adjusted such that 90° net polarization-rotation occurs, and the P-orientation is changed to S-orientation. In this, way beam-1 and beam-6 are effectively plane-polarized with S-orientation, and with losses being only usual low optical losses associated with the manufacture of the polarizer and polarization rotators. These optical losses could be expected to be a total of less than about 10%.

In the case of S and P portions of beam-3 and beam 4, the upper polarization-rotator is arranged such that no net polarization-rotation occurs. The lower polarization-rotator is adjusted such that 90° net polarization rotation occurs and the S-orientation is changed to P-orientation. In this way beam-3 and beam-4 are effectively plane-polarized with P-orientation.

In the case of S and P portions of beam-2 and beam 5, the upper and lower polarization-rotators are arranged such that non-orthogonal polarization-rotation occurs in each beam-portion, for example, net 45° rotation. In this way, beam-2 and beam-5 are effectively plane-polarized with a non-orthogonal (I) orientation, relative to the long- and short-system axes. The S, I, and P orientations relative to the long and short (orthogonally aligned transverse) system axes are schematically depicted in FIG. 1B.

Following the above-described plane-polarization of beam-1, beam-2, beam-3, beam 4, beam-5, and beam-6, the inventive apparatus is arranged to project a line of radiation in the manner of prior-art apparatus. Each of the six polarized (two-portion) beams is transmitted through a long-axis "homogenizer" 22 including two spaced-apart arrays 24A and 24B of cylindrical lenses ("lenslets") acting as long axis homogenizers. While one pair of arrays is provided for each beam in the arrangement of FIG. 1A, adjacent arrays may be combined in a single array with some unused lenslets. By way of example, one pair of such combined arrays may be used for two adjacent beams.

Following transmission through the lens arrays, the beams are transmitted through a long-axis cylindrical condenser lens $L_3$ having power in the long-axis only, a short-axis cylindrical condenser lens $L_4$ having power in the short-axis only, a long-axis cylindrical field lens $L_5$ having power in the long-axis only, and a short-axis cylindrical projection lens $L_6$ having power in the short-axis only. This results in a projected line of radiation of length L on a panel being irradiated, with the L being the width of a long-axis exit-pupil of the apparatus. There is a homogenized, short-axis beam (not shown) in the exit-pupil. Radiation-intensity along the line is homogenized by the combination of the lens arrays of homogenizers 22 and the long-axis condenser and projection lenses. Rays forming any point on the line, however, has a particular, predetermined, angular distribution of polarization in the long-axis (y-z) plane.

In order to illustrate the effect of plane-polarization in providing this angular distribution in the inventive apparatus, the formation of points at each end of the projected line, and a point at the center of the projected line, is illustrated by tracing, for each point, a three rays for each of the S, I and P polarization-orientations. The S-polarized rays are indicated by short-dashed lines; the I-polarized rays are indicated by medium-dashed lines; and the P-polarized rays are indicated by long-dashed lines.

FIG. 1C schematically illustrates an expanded view of the rays forming an end-point on the projected line. It can be seen that the point is formed by a fan of rays with rays having the highest incidence angles on the panel being S-polarized, rays having the lowest incidence angles on the panel being P-polarized, and rays having incidence angles between the highest and the lowest being I-polarized. This angular distribution of polarization is the same (at least in the angular-direction sense) at any point on the projected line.

It is pointed out here that a short-axis view of the inventive apparatus is not necessary for understanding principles of the present invention, and is not presented herein for simplicity of description. Those skilled in the art will be able to construct a short-axis view of the apparatus of FIG. 1A from prior knowledge of line-projection apparatus, or by consulting one of the above-referenced and incorporated patents, particularly U.S. Pat. No. 8,937,770. Certain features relevant only to short-axis operation of the inventive apparatus have been omitted from FIG. 1A for simplicity of illustration and description, but would be present in actual apparatus. These include short-axis cylindrical lens arrays, which would be placed in the long-axis reduced beams ahead of the polarization defining arrangements, and a short-axis slit-aperture that would be placed at a short-axis intermediate image field (not shown) between lenses $L_4$ and $L_5$.

Those skilled in the art will recognize from the detailed description of the invention presented above, that more or less beams may be combined to form different long-axis angular distributions of polarization, although at least two of the beams combined must have different polarization-orientation. By way of example, the polarization distribution may be arranged such that the highest angles of incidence are P-polarized and the lowest angles of incidence are S-polarized. More generally, the device can be arranged so that the polarization state is dependent upon the angle of incidence of the rays, but may or may not be either S or P polarized. It is also possible to locate the polarization arrangements of polarizer, reflector, and polarization rotators ahead of the beam de-magnifying lenses. Those skilled in the art may conceive any such alternate arrangement without departing from the spirit and scope of the present invention.

In summary, the present invention is described above in terms of a preferred embodiment. The invention, however, is not limited to the embodiment described and depicted herein. Rather, the embodiment is limited only by the claims appended hereto.

What is claimed is:

1. An apparatus for projecting a plurality of laser beams into a line focus on a workpiece comprising:
   a set of polarization optics for receiving the laser beams; and
   a lens system for receiving the polarized beams and arranged to project the beams in a manner to irradiate the workpiece along a line focus, said polarization optics and lens system arranged such that at each location along the line focus, the light rays with the lowest angle of incidence along the long axis of the line have a first polarization and the light rays with the highest angle of incidence along the long axis of the line have a second polarization orthogonal to the first polarization and the light rays with intermediate angles of incidence along the long axis of the line have an intermediate polarization state.

2. An apparatus as recited in claim 1, wherein said set of polarization optics includes at least one partially transmitting polarizer and one polarization rotator, said partially transmitting polarizer for transmitting one of the first or second polarizations and reflecting the remaining polarization and said polarization rotator is positioned to rotate either the transmitted portion or the reflected portion of the light by ninety degrees.

3. An apparatus as recited in claim 2, wherein said set of polarization optics includes at least one partially transmitting polarizer and first and second polarization rotators, said partially transmitting polarizer for transmitting one of the first or second polarizations and reflecting the remaining polarization and wherein the first polarization rotator is positioned to rotate the transmitted portion of the light by 45 degrees and the second polarization rotator is positioned to rotate the reflected portion of the light by 45 degrees.

4. An apparatus for projecting a plurality of laser beams into a line focus on a workpiece comprising:
   a set of polarization optics for receiving the laser beams; and
   a lens system for receiving the polarized beams and arranged to project the beams in a manner to irradiate the workpiece along a line focus, said polarization optics and lens system arranged such that at each location along the line focus, the light rays with the lowest angle of incidence along the long axis of the line have a first polarization state and the light rays with the highest angle of incidence along the long axis of the line have a second polarization state.

5. An apparatus as recited in claim 4, wherein the light rays with intermediate angles of incidence along the long axis of the line have a third polarization state.

6. An optical apparatus for projecting a first and second plane polarized laser beams onto a workpiece, said first beam having a first polarization state and said second beam having second polarization state different from the first polarization state, said apparatus comprising:
   a series of lenses for projecting said first and second beams in a manner to irradiate the workpiece as a line of laser radiation with rays from each of the laser beams incident at different angles of incidence at any point along the line, with the polarization orientation varying with the angle of incidence along the long axis of the line in a predetermined manner.

7. The apparatus as recited in claim 6 wherein the polarization state of the rays having the lowest angles of incidence are predominantly plane polarized parallel to the long axis of the line and the rays with the highest angles of incidence are predominantly plane polarized perpendicular to the long axis of the line.

8. The apparatus of claim 7 for projecting a third plane polarized laser beam onto the workpiece, wherein the third plane polarized beam has a third polarization state intermediate the first and second polarization states and wherein the rays having angles of incidence intermediate the lowest and highest angle of incidence have an intermediate polarization state.

9. An optical apparatus for projecting a first, second, and third plane polarized laser beams onto a workpiece, said first beam having a first polarization state, said second beam having second polarization state orthogonal to the first polarization state, and said third beam having a polarization state intermediate the first and second polarization states, said apparatus comprising:
   a series of lenses for projecting said first, second, and third beams in a manner to irradiate the workpiece as a line of laser radiation and wherein the rays having a lowest angle of incidence along the long axis of the line have the first polarization state and wherein the rays having the highest angles of incidence along the long axis of the line have the second polarization state and the rays having intermediate angles of incidence along the long axis of the line have the intermediary polarization state.

10. The apparatus as recited in claim 9 wherein the polarization state of the rays having the lowest angles of incidence are predominantly plane polarized parallel to the long axis of the line and the rays with the highest angles of incidence are predominantly plane polarized perpendicular to the long axis of the line and the rays with the intermediate angles of incidence are plane polarized with an intermediate polarization state.

11. An apparatus as recited in claim 9 wherein the laser beams are generated by one or more excimer lasers and further including a plurality of polarizers arranged to receive the laser beams, said polarizers being configured such that said first beam has the first polarization state, the second beam has the second polarization state and third beam has the intermediate polarization state.

12. An apparatus as recited in claim 1 wherein the laser beams are generated by one or more excimer lasers and wherein the polarization optics are arranged to receive the laser beams, said polarization optics being configured so that a first beam has the first polarization, a second beam has the second polarization and a third beam has the intermediate polarization.

13. An apparatus as recited in claim 4 wherein the laser beams are generated by one or more excimer lasers and wherein the polarization optics are arranged to receive the laser beams, said polarization optics being configured so that a first beam has a first polarization state and second beam has a second polarization state.

14. An apparatus as recited in claim 6 wherein the laser beams are generated by one or more excimer lasers and further including a plurality of polarizers arranged to receive the laser beams, said polarizers being configured such that said first beam has the first polarization state and the second beam has the second polarization state.

* * * * *